United States Patent [19]
Narita

[11] Patent Number: 5,717,559
[45] Date of Patent: Feb. 10, 1998

[54] INPUT/OUTPUT PROTECTION DEVICE FOR USE IN SEMICONDUCTOR DEVICE

[75] Inventor: Kaoru Narita, Tokyo, Japan

[73] Assignee: NEC Corporation, Tokyo, Japan

[21] Appl. No.: 686,545

[22] Filed: Jul. 26, 1996

[30] Foreign Application Priority Data

Jul. 28, 1995 [JP] Japan ................................. 7-193339

[51] Int. Cl.$^6$ ..................................................... H02H 9/00
[52] U.S. Cl. ............................................. 361/56; 361/111
[58] Field of Search ............................... 361/18, 56, 58, 361/91, 100, 111, 118, 119, 126, 127; 257/107, 109, 110, 112, 355–357, 360–363

[56] References Cited

U.S. PATENT DOCUMENTS

| | | | |
|---|---|---|---|
| 5,274,262 | 12/1993 | Avery | 257/362 |
| 5,572,394 | 11/1996 | Ker et al. | 361/56 |
| 5,602,404 | 2/1997 | Chen et al. | 257/356 |

FOREIGN PATENT DOCUMENTS 2-52426  11/1990  Japan ............... H01L 27/092

OTHER PUBLICATIONS

R.N. Rountree et al., "A Process–Tolerant Input Protection Circuit for Advanced CMOS Processes", *1988 EOS/ESD Symposium Proceedings*, 1988, pp. 201–205 No Month.

*Primary Examiner*—Ronald W. Leja
*Attorney, Agent, or Firm*—Sughrue, Mion, Zinn, Macpeak & Seas, PLLC

[57] ABSTRACT

An input/output protection device for protecting an internal circuit of an integrated circuit formed on a P-type substrate, from an electrostatic discharge (ESD), includes a thyristor connected between a terminal connected to the internal circuit and a common wiring conductor. The protection device comprises a N-well formed in the P-type substrate, a first P-type diffused region formed in the N-well and connected to the terminal, a first N-diffused region formed to adjoin the first N-well, a second P-type diffused region formed in close proximity to the first N-type diffused region, and a second N-type diffused region formed in the P-type substrate and connected to the common wiring conductor. An external resistor is connected between the first P-type diffused region and the first N-type diffused region, and another external resistor is connected between the second P-type diffused region and the second N-type diffused region. A diode is constituted of the first N-diffused region and the second P-type diffused region in close proximity to each other, so that the diode has a low parasitic resistance. Thus, when a negative electrostatic pulse is applied to the terminal, the diode allows a forward current to flow from the common wiring conductor to the terminal through a low impedance path including the first resistor, the diode and the second resistor.

19 Claims, 5 Drawing Sheets

INPUT/OUTPUT PROTECTION DEVICE FOR USE IN SEMICONDUCTOR DEVICE

BACKGROUND OF THE INVENTION

1. Field of the Invention

The present invention relates to a semiconductor device, and more specifically to an input/output protection device for protecting a semiconductor integrated circuit from destruction due to an electrostatic discharge (ESD).

2. Description of Related Art

In the prior art, a lateral thyristor, which has been used as a device for protecting a semiconductor integrated circuit from destruction due to ESD, is disclosed by, for example, U.S. Pat. No. 5,274,262 and Japanese Patent Publication No. JP-B-2-052426, the disclosure of which is incorporated by reference in their entirety into this application.

Figure 1:
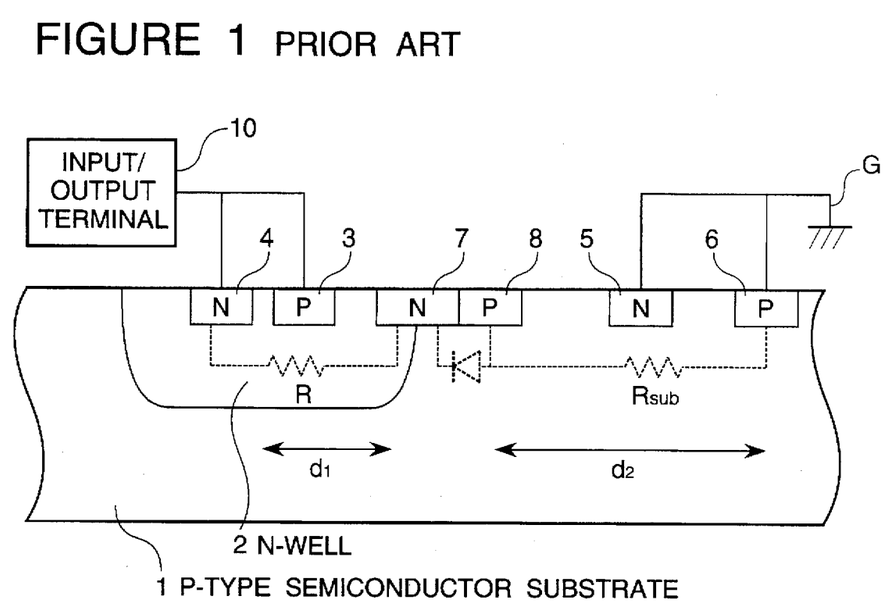
FIG. 1 is a diagrammatic sectional view of the prior art lateral thyristor for protecting a semiconductor integrated circuit from an ESD.
Figure 2:
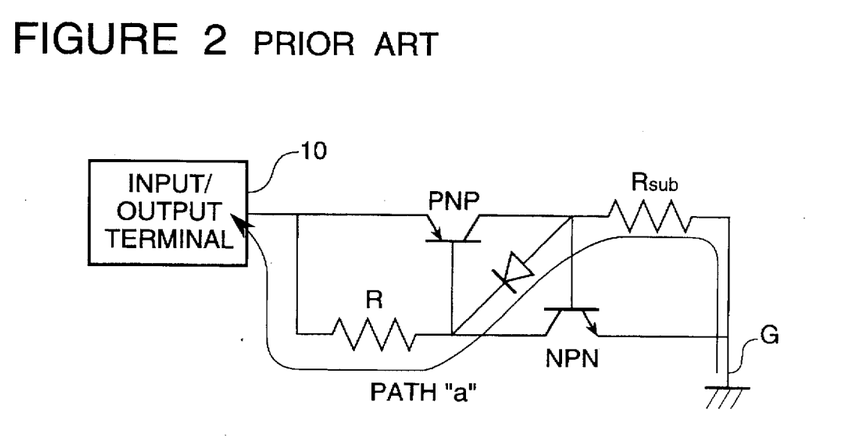
FIG. 2 is an equivalent circuit of the lateral thyristor shown in FIG. 1.

Referring to FIG. 2, there is shown a diagrammatic sectional view of the prior art lateral thyristor disclosed by U.S. Pat. No. 5,274,262. FIG. 2 is an equivalent circuit of the thyristor shown in FIG. 1.

As shown in FIG. 1, the prior art lateral thyristor includes a P-type semiconductor substrate 1 having an N-well 2, which is formed at a principal surface thereof and which has a P-type diffused region 3 and an N-type diffused region 3 formed separately from each other in the N-well 2 and connected to a terminal 10 (which may be an input terminal, an output terminal, an input/output terminal, a ground (GND) terminal, a power supply (VCC) terminal, or the like). In the following, the "terminal 10" should be understood to be representative of various terminals including an input terminal, an output terminal, an input/output terminal, a ground (GND) terminal, a power supply (VCC) terminal, or the like.

The prior art lateral thyristor also includes an N-type diffused region 5 and a P-type diffused region 6, which are formed at the principal surface of the substrate 1, separately from each other and from the N-well 2, and which are connected to a common wiring conductor G (for example, a ground line). The prior art lateral thyristor further includes an N-type diffused region 7 of a high impurity concentration formed at a boundary between the N-well 2 and the substrate 1 to bridge the N-well 2 and the substrate 1, and a P-type diffused region 8 of a high impurity concentration formed in close proximity to the N-type diffused region 7 at the principal surface of the substrate 1, to form a PN junction between the P-type diffused region 8 and the N-type diffused region 7. The N-type diffused region 7 and the P-type diffused region 8 of the high impurity concentration are provided for lower an avalanche breakdown voltage of the N-well 2 to the substrate 1.

In the above mentioned construction, when an electrostatic pulse positive to the ground line 10 is applied to the terminal 10, a reverse bias is applied through the N-diffused region 4 between the N-well 2 and the P-type substrate 1, but since the high impurity concentration N-diffused region 7 and the high impurity concentration P-diffused region 8 are provided in close proximity to each other, a breakdown occurs at the junction between the N-diffused region 7 and the P-diffused region 8, so that a trigger current flows. As a result, a current flows from the terminal 10 through the N-diffused region 4, the N-well 2, the N-diffused region 7, and the P-diffused region 8 to the P-type substrate 1, and further flows the P-type substrate 1 through the P-diffused region 6 to the ground line G. Because of this current, a substrate potential in proximity of the N-diffused region 5 elevates by action of a resistance Rsub of the substrate 1.

If the substrate potential in proximity of the N-diffused region 5 exceeds a built-in potential of the PN junction formed between the P-type substrate 1 and the N-diffused region 5, a forward current starts to flow from the substrate 1 to the N-type diffused region 5. This corresponds to a situation that a base current of an NPN transistor flows in the equivalent circuit of FIG. 2. As a result, this NPN transistor is turned on. If a collector current flows in the NPN transistor as the result of the turning-on of the NPN transistor, a base potential of a PNP transistor in the equivalent circuit of FIG. 2 drops because of a sheet resistance or substrate resistance R of the N-well 2, with the result that a base current of the PNP transistor flows from the terminal 10 through the P-diffused region 3 to the N-well 2, so that the PNP transistor is turned on.

The collector current of the PNP transistor elevates the base potential of the NPN transistor, and the elevation of the base potential results in increase of the base current of the NPN transistor. As a result, the circuit enters a thyristor action in which each of the PNP transistor and the NPN transistor mutually increases the collector of the other transistor. Accordingly, a path between the terminal 10 and the ground line G becomes an extremely low impedance, so that the electrostatic pulse is quickly discharged.

As mentioned above, when an electrostatic pulse positive to the common wiring is applied in the above mentioned lateral thyristor, the electrostatic pulse is effectively discharged by the above mentioned thyristor action, so that an internal circuit is protected. However, when an electrostatic pulse negative to the common wiring is applied, the applied electrostatic pulse cannot be necessarily effectively discharged.

In brief, when an electrostatic pulse negative to the ground line G is applied to the terminal 10, a discharge path for the electrostatic pulse is formed as shown by a path "a" in the equivalent circuit of FIG. 2, to go from the ground line G through the resistance Rsub of the substrate 1, the diode and the resistor R in the well 2 to the terminal 10. Accordingly, considering the structure shown in FIG. 1, the discharge current flows from the ground line G through the P-type diffused region 6, the P-type substrate 1, the P-type diffused region 8, the N-type diffused region 7, the N-well 2, the N-type diffused region 4 to the terminal 10.

In the resistors included in this discharge path "a", the resistance of the resistor R is mainly determined by a sheet resistance of the N-well 2 and a distance "d1" between the N-type diffused regions 4 and 7. Assuming that the sheet resistance of the N-well 2 is 100 $\Omega/\square$ and the distance "d1" is 10 µm, and also assuming that the width of the current path of the thyristor is 100 µm, the resistance of the resistor R is approximated to 10 $\Omega$ (=(10/100)×100$\Omega$).

On the other hand, the resistance of the substrate resistor Rsub is mainly determined by a sheet resistance of the substrate 1 and a distance "d2" between the P-type diffused regions 6 and 8. Assuming that the sheet resistance of the substrate 1 is 500 $\Omega/\square$ and the distance "d2" is 50 µm, since the width of the current path of the thyristor is 100 µm as mentioned above, the resistance of the resistor Rsub is approximated to 250$\Omega$(=(50/100)×500$\Omega$). In addition, a parasitic resistance value of the diode is on the order of a few $\Omega$, Therefore, the resistance of the discharge path when the negative electrostatic pulse is applied, is mainly composed of the resistance of the resistor Rsub, and is larger than 250$\Omega$.

In the above mentioned example, it has been assumed that the P-type diffused region 6 is formed in proximity of the N-diffused region 5, but it is in some cases that the P-type diffused region 6 is not formed in proximity of the N-diffused region 5. In these cases, the resistance of the resistor Rsub becomes ever larger, since a distance between the the P-type diffused regions 6 and 8 becomes long.

Because the resistance value of the discharge path when the negative electrostatic pulse is applied is large, the current for discharging the applied electrostatic pulse is not so easy to flow through the protection device, with the result that a large stress is inevitably applied to the internal circuit, so that the internal circuit is easily destroyed.

SUMMARY OF THE INVENTION

Accordingly, it is an object of the present invention to provide an input/output protection device for protecting a semiconductor integrated circuit from an electrostatic discharge (ESD), which has overcome the above mentioned defect of the conventional one.

Another object of the present invention is to provide an input/output protection device for protecting a semiconductor integrated circuit from destruction due to and ESD by having a sufficiently low impedance regardless of whether an applied electrostatic pulse is a positive pulse or a negative pulse.

The above and other objects of the present invention are achieved in accordance with the present invention by an input/output protection device for protecting, from an ESD, an internal circuit of a semiconductor integrated circuit formed on a semiconductor substrate, the protection device being connected between a terminal connected to the internal circuit and a common wiring conductor, the protection device comprising a thyristor and a diode both formed in the semiconductor substrate, the thyristor being constituted of a PNP transistor and an NPN transistor, both formed in the semiconductor substrate and both having a P-type region of a high impurity concentration and an N-type region of a high impurity concentration, which are formed in close proximity to each other in the semiconductor substrate and which are common to the PNP transistor and the NPN transistor, the thyristor further including a first resistor and a second resistor provided externally of the semiconductor substrate, the first resistor being connected between an emitter and a base of the PNP transistor, and the second resistor being connected between an emitter and a base of the NPN transistor, so that when a positive electrostatic pulse is applied to the terminal, the thyristor allowing a forward conducting current to flow from the terminal through the thyristor to the common wiring conductor, and the diode being constituted of the P-type region of the high impurity concentration and the N-type region of the high impurity concentration which are in close proximity to each other and which are connected to the terminal and the common wiring conductor through the first resistor and the second resistor, respectively, so that when a negative electrostatic pulse is applied to the terminal, the diode allows a forward current to flow from the common wiring conductor to the terminal through a low impedance path including the first resistor, the diode and the second resistor, without a parasitic resistance in the semiconductor substrate.

In the above mentioned input/output protection device, the first resistor and the second resistor adjust a holding current, a holding voltage and a conduction resistance of a forward direction thyristor characteristics of the thyristor.

More specifically, there is provided an input/output protection device for protecting, from an ESD, an internal circuit of a semiconductor integrated circuit formed on a semiconductor substrate, the protection device being connected between a terminal connected to the internal circuit and a common wiring conductor, the protection device comprising a thyristor and a diode both formed in the semiconductor substrate, the thyristor being constituted of a first bipolar transistor and a second bipolar transistor of different conductivity types, both formed in the semiconductor substrate, and a first resistor and a second resistor both provided externally of the semiconductor substrate, the first bipolar transistor being constituted of a first diffused region and a second diffused region, which are of a first conductivity type and which are formed in the semiconductor substrate, and a third diffused region which is of a second conductivity type opposite to the first conductivity type and which is formed in the semiconductor substrate between the first diffused region and the second diffused region, the second diffused region and the third diffused region being of a high impurity concentration, the second bipolar transistor being constituted of the third diffused region, the second diffused region and a fourth diffused region which is of the second conductivity type and which is formed in the semiconductor substrate at a side of the second diffused region opposite to the third diffused region, the first resistor being connected between the first diffused region and the third diffused region, and the second resistor being connected between the second diffused region and the fourth diffused region, so that when a positive electrostatic pulse is applied to the terminal, the thyristor allowing a forward conducting current to flow from the terminal through the thyristor to the common wiring conductor, the diode being constituted of the second diffused region and the third diffused region of the high impurity concentration, the second diffused region and the third diffused region being formed in close proximity to each other, so that when a negative electrostatic pulse is applied to the terminal, the diode allows a forward current to flow from the common wiring conductor to the terminal through a low impedance path including the first resistor, the diode and the second resistor, without a parasitic resistance in the semiconductor substrate.

Preferably, the first diffused region is formed in a fifth diffused region which is formed in the semiconductor substrate and which is of the second conductivity type opposite to that of the semiconductor substrate. In addition, the fourth diffused region is formed in a sixth diffused region which is formed in the semiconductor substrate and which is of the second conductivity type.

More preferably, the fifth diffused region and the sixth diffused region are formed deeply in the semiconductor substrate, and the sixth diffused region has an impurity concentration lower than that of the fourth diffused region.

As seen from the above, in the protection device in accordance with the present invention, the P-type diffused region and the N-type diffused region of the high impurity concentration, which constitute the diode, are formed in close proximity to each other, and are connected through the first and second external resistors to the terminal and the common wiring conductor, respectively, so that a parasitic resistance associated with the diode is minimized. On the other hand, the resistors which adjust the thyristor action and through which the forward current of the diode flow, are provided externally of the semiconductor substrate. Therefore, the thyristor action can be easily controlled by the external resistors, and the resistance of the path of the forward current of the diode flow can be sufficiently reduced by lowering the resistance of the external resistors.

Therefore, not only when a positive electrostatic pulse is applied but also when a negative electrostatic pulse is applied, the protection device in accordance with the present invention becomes a sufficiently low impedance so as to allow a discharge current to flow effectively, resulting in less stress being applied to the internal circuit, and the ability to withstand higher ESD voltage.

The above and other objects, features and advantages of the present invention will be apparent from the following description of a preferred embodiment of the invention with reference to the accompanying drawings.

DESCRIPTION OF THE PREFERRED EMBODIMENT

Figure 3:
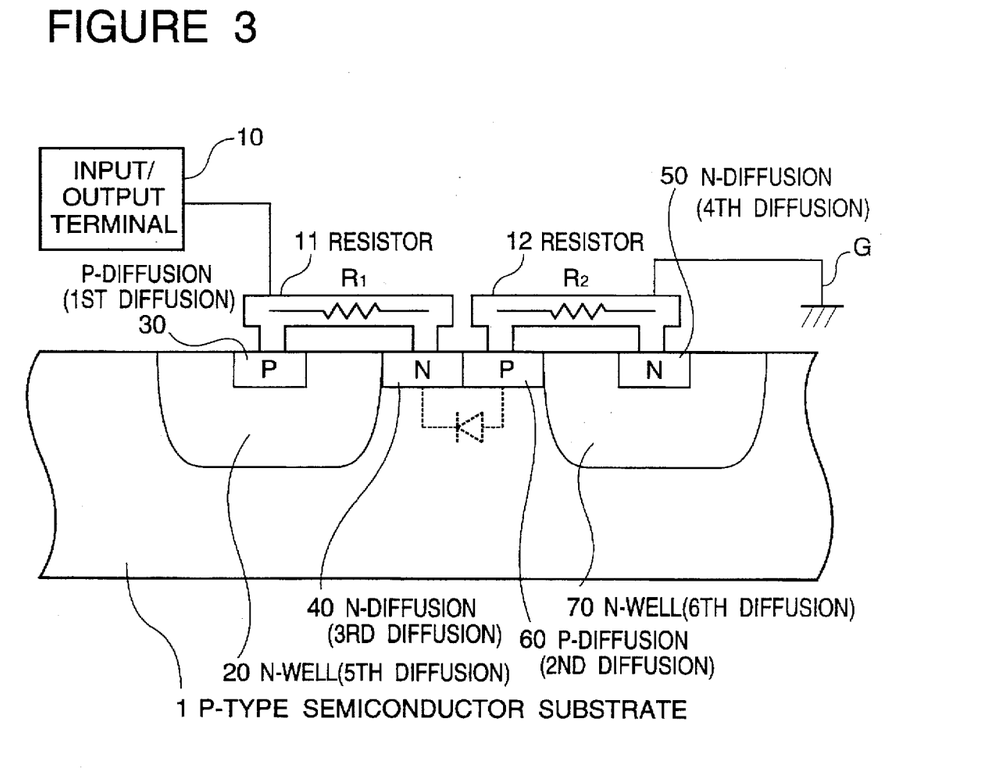
FIG. 3 is a diagrammatic sectional view of an embodiment of the protection device in accordance with the present invention, for protecting a semiconductor integrated circuit from an ESD.
Figure 4:
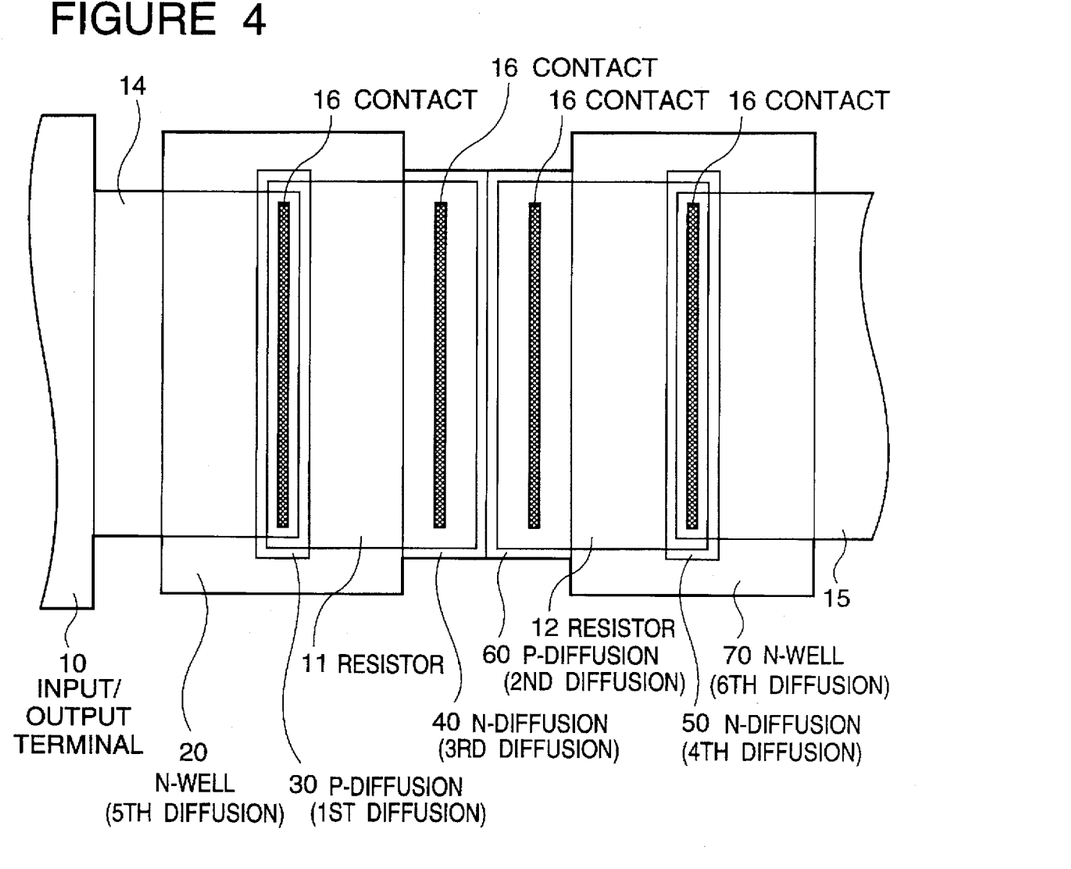
FIG. 4 is a diagrammatic plan view of the shown in FIG. 3.

Referring to FIG. 3, there is shown a diagrammatic sectional view of an embodiment of the protection device in accordance with the present invention, for protecting a semiconductor integrated circuit from an electrostatic discharge (ESD). In FIG. 3, elements corresponding to those shown in FIG. 1 are given the same Reference Numerals or Signs. FIG. 4 is a diagrammatic plan view of the shown in FIG. 3, and FIG. 5 is an equivalent circuit of the protection device shown in FIG. 3.

Figure 5:
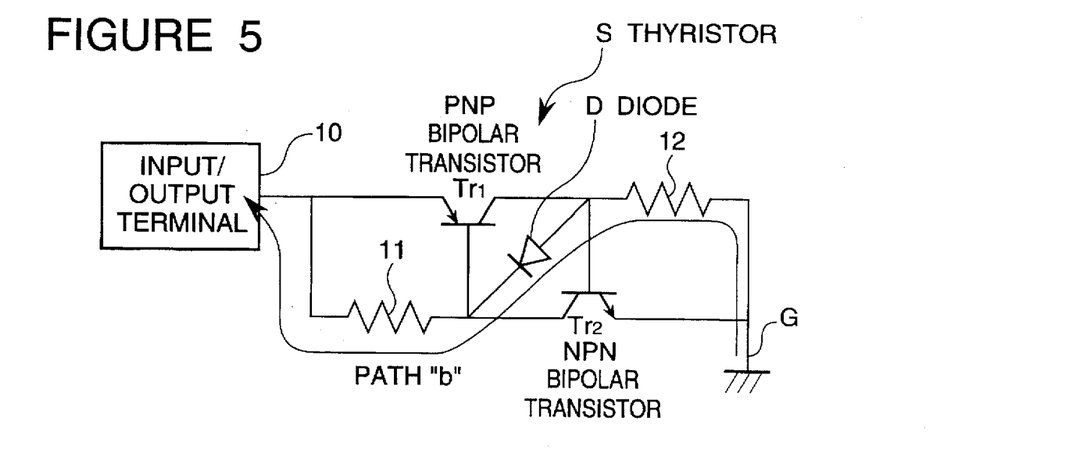
FIG. 5 is an equivalent circuit of the protection device shown in FIG. 3.

As seen from the equivalent circuit of FIG. 5, the embodiment of the protection device in accordance with the present invention is fundamentally composed of a thyristor S and a diode D, which are connected between a terminal 10 for an internal circuit and a common wiring conductor G connected to ground, for the purpose of preventing an destruction of the internal circuit by ESD.

Specifically, the thyristor S and the diode D are formed in the same semiconductor substrate 1, on which the internal circuit is also formed.

The thyristor S includes a pair of bipolar transistors of different conductivity types formed in the semiconductor substrate 1, and a pair of adjusting resistors 11 and 12 which are provided externally of the semiconductor substrate 1 and each of which has a resistance smaller than the substrate resistance (such as 250Ω in the prior art explained hereinbefore), for determining a characteristics of a thyristor action so that a forward conducting current flows when a positive electrostatic pulse is applied.

The diode D is formed of an P-type region and an N-type region, which have a high impurity concentration and are formed in close proximity to each other in the semiconductor substrate 1, and which are connected to the above mentioned adjusting resistors 11 and 12, respectively, which are in turn connected to the terminal 10 and the common wiring conductor G, respectively, with the result that a parasitic resistance associated with the diode is minimized. Therefore, this diode D forms a low impedance path when a negative electrostatic pulse is applied.

Figure 7:
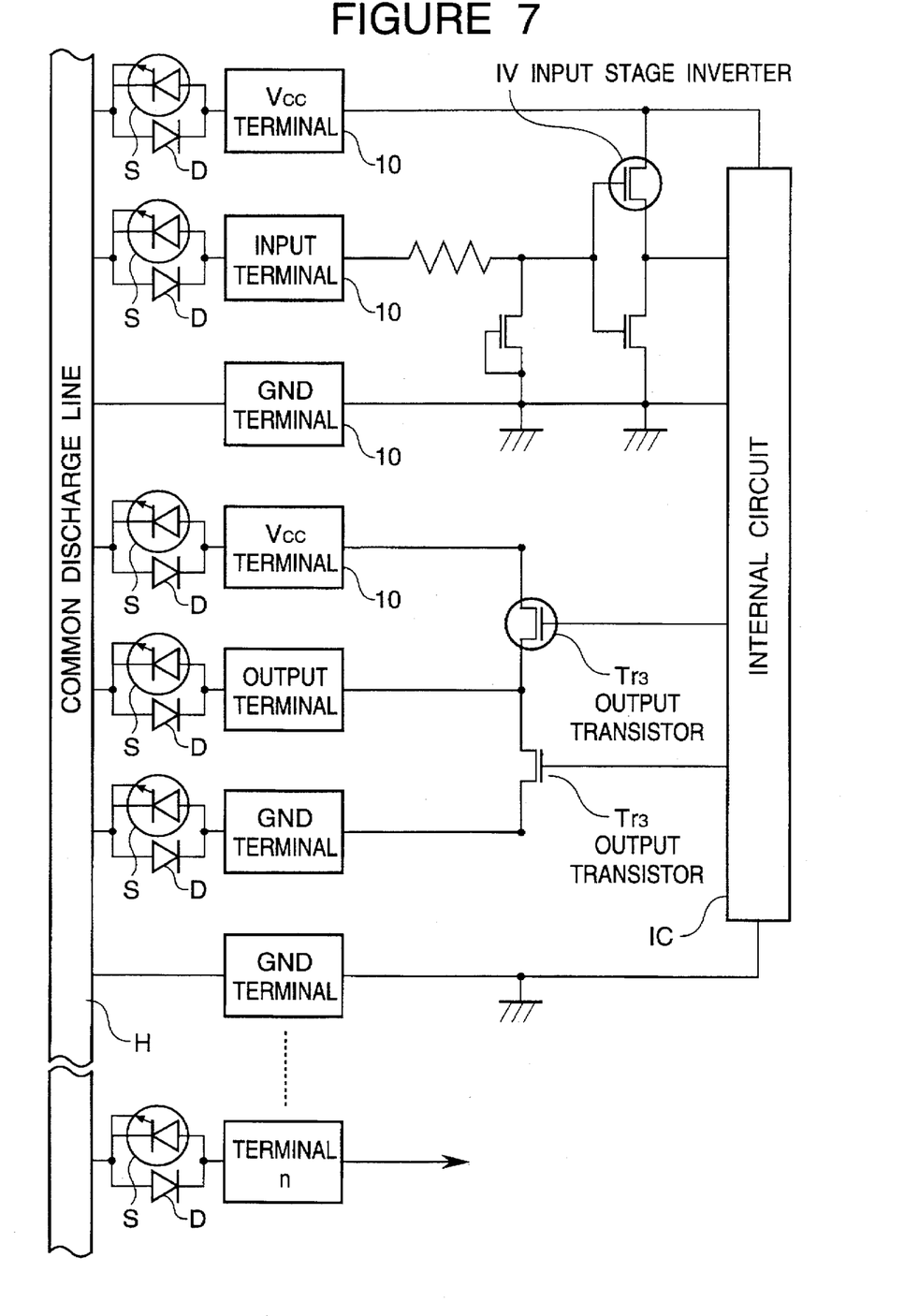
FIG. 7 is a block diagram illustrating a part of an example of a CMOS LSI in which the input/output protection device in accordance with the present invention is applied.

As mentioned hereinbefore, the terminal 10 is representative of various terminals including an input terminal, an output terminal, an input/output terminal, a ground (GND) terminal, a power supply (VCC) terminal, or the like. On the other hand, the common wiring conductor is formed separately of the internal circuit and can be a ground line as shown in FIG. 3 or a common discharge line as shown in FIG. 7.

The adjusting resistors 11 and 12 are intended to adjust a holding potential, a holding current and a conduction resistance of the forward direction thyristor characteristics of the thyristor S.

More specifically, the thyristor S is composed of first and second bipolar transistors Tr1 and Tr2 of different conductivity types, and adjusting resistors R1 and R2 as shown in FIGS. 3 and 5. The first bipolar transistor Tr1 is formed of first and second diffused regions 30 and 60 and a third diffused region 40 located between the first and second diffused regions 30 and 60 and having a conductivity different from that of the first and second diffused regions 30 and 60. The bipolar transistor Tr2 is composed of the second diffused region 60 and the third diffused region 40 and a fourth diffused region 50 which are located at opposite sides of the second diffused region 60 and which have a conductivity different from that of the second diffused region 60.

The adjusting resistor 11 is composed of a first resistor externally connected at its opposite ends to the first diffused region 30 and the third diffused region 40, respectively. The adjusting resistor 12 is composed of a second resistor also externally connected to its opposite ends to the second diffused region 60 and the fourth diffused region 50, respectively.

The diode D is constituted of the second diffused region 60 and the third diffused region 40 which are of a high impurity concentration and which are formed in close proximity to each other.

The first diffused region 30 is formed within a fifth diffused region 20 which is formed in the semiconductor substrate 1 and which has conductivity different from that of the semiconductor substrate 1 and from that of the first diffused region 30. The fourth diffused region 50 is formed within a sixth diffused region 70 which is formed in the semiconductor substrate 1 and which has a conductivity which is different from that of the semiconductor substrate 1 and but the same as that of the fourth diffused region 50. The fifth and sixth diffused regions 20 and 70 are formed deeply in the semiconductor substrate 1, and the sixth diffused region 70 has an impurity concentration lower than that of the fourth diffused region 50. In other words, the impurity concentration of the fourth diffused region 50 is higher than that of the sixth diffused region 70.

Now, a specific example of the protection device in accordance with the present invention will be described with reference to FIGS. 3, 4 and 5.

Referring to FIG. 3, the example includes a P-type silicon substrate 1, which has an impurity concentration of for example $1 \times 10^{16}$ cm$^{-3}$ to $2 \times 10^{16}$ cm$^{-3}$ (sheet resistance of 100 Ω/☐), and which has an N-well (fifth diffused region) 20 formed deeply at a principal surface of the substrate 1. This N-well 20 has an impurity concentration of for example $1 \times 10^{17}$ cm$^{-3}$ (sheet resistance of 250 Ω/☐). A P-type diffused region (first diffused region) 30 is formed at a center portion of the N-well 20, and an N-type diffused region (third diffused region) 40 of a high impurity concentration is formed at the principal surface of the substrate 1, to adjoin the N-well 20. Furthermore, a P-type diffused region (second diffused region) 60 of a high impurity concentration is formed at the principal surface of the substrate 1, in close proximity to the N-type diffused region 40, with a distance on the order of not greater than a few micrometers. Another N-well 70 having the same impurity concentration as that of the N-well 20, is formed at the principal surface of the substrate 1., to adjoin the P-type diffused region 60. An N-type diffused region 50 is formed at a center portion of the N-well 70. With this construction, as the first bipolar transistor, a PNP transistor Tr1 is formed of the diffused regions 30, 40 and 60, and as the second bipolar transistor, an NPN transistor Tr2 is formed of the diffused regions 40, 60 and 50. The diode D is formed of the diffused regions 40 and 60.

The resistor 11 having the resistance R1 is formed of for example an external resistive layer, which is formed above the substrate 1 but electrically insulated from the substrate 1. The resistor 11 is connected between the P-type diffused region 30 and the N-type diffused region 40, by connecting opposite ends of the resistive layer to the P-type diffused region 30 and the N-type diffused region 40, through contact holes 16, respectively, as shown in FIG. 4. Similarly, the resistor 12 having the resistance R2 is formed of for example an external resistive layer which is formed above the substrate 1 but electrically insulated from the substrate 1. The resistor 12 is connected between the N-type diffused region 50 and the P-type diffused region 60, by connecting opposite ends of the resistive layer to the N-type diffused region 50 and the P-type diffused region 60, through contact holes 16, respectively, as shown in FIG. 4. Each of the resistances R1 and R2 is smaller than the substrate resistance of the substrate 1.

More specifically, the external resistors 11 and 12 are formed of for example, a phosphorus doped polysilicon, a tungsten silicide (WSi) or a tungsten (W). If the external resistors 11 and 12 are formed of the phosphorus doped polysilicon, these resistors can be formed simultaneously when a gate electrode of a MOS transistor or an electrode of a capacitor is formed in the way of a conventional integrated circuit manufacturing process. If the external resistors 11 and 12 are formed of the tungsten silicide (WSi) or the tungsten (W), these resistors can be formed simultaneously when an upper layer wiring conductor is formed. Therefore, the external resistors 11 and 12 can be formed without adding an extra process to the conventional integrated circuit manufacturing process.

An aluminum wiring conductor 14 is formed to extend from the terminal 10 to reach the P-type diffused region 30, where the aluminum wiring conductor 14 is electrically connected to the P-type diffused region 30 through the contact 16, as shown in FIG. 4. Furthermore, another aluminum wiring conductor 15 is formed to extend from the ground line G (as the common wiring conductor) to reach the N-type diffused region 50, where the aluminum wiring conductor 15 is electrically connected to the N-type diffused region 50 through the contact 16, as shown in FIG. 4.

Now, operation will be described.

When a positive electrostatic pulse is applied to the terminal 10, a diode formed of the N-type diffused region 40 and the P-type diffused region 60 causes an avalanche breakdown, which becomes a trigger current for the thyristor. This trigger current flows through the resistor 12 to the ground line G, so that a substrate potential of the P-type diffused region 60 elevates. If this elevated substrate potential of the P-type diffused region 60 exceeds a built-in voltage potential of the PN junction formed between the P-type substrate 1 and the N-well 70, a forward current starts to flow from the substrate 1 to the N-well 70.

This forward current corresponds to base current of the NPN transistor Tr2 in the equivalent circuit of FIG. 5. As a result, this NPN transistor is turned on. A collector current of the NPN transistor flows from the terminal 10 through the resistor 11. This results in drop of a base potential of the PNP transistor Tr1, and therefore, a base current flows in the PNP transistor. Thus, the PNP transistor Tr1 is turned on.

The collector current of the PNP transistor elevates the base potential of the NPN transistor, and the elevation of the base potential results in increase of the base current of the NPN transistor. As a result, the circuit enters a thyristor action in which each of the PNP transistor and the NPN transistor mutually increases the collector of the other transistor. Accordingly, a path between the terminal 10 and the ground line G becomes an extremely low impedance, so that the electrostatic pulse is quickly discharged.

The above mentioned operation can be realized even if the N-well 70 is not provided. However, the N-well 70 gives the following two advantages. First, since the N-well 70 has the impurity concentration lower than that of the N-type diffused region 50, the build-in potential becomes low, so that the forward current becomes to easily flow, and therefore, the device easily enters the thyristor action. Secondly, holes injected from the anode of the diode are effectively collected by forming the diffused region 70 (namely, the N-well) deeply, and therefore, a conduction resistance after the thyristor action becomes small.

In the prior art example, the substrate resistance values R and Rsub, by which the characteristics of the thyristor action is determined, are determined by parasitic resistances, and therefore, control of the resistance value is very difficult. In the present invention, however, the characteristics of the thyristor action can be easily determined by adjusting the resistances R1 and R2 of the external resistors 11 and 12.

Figure 6:
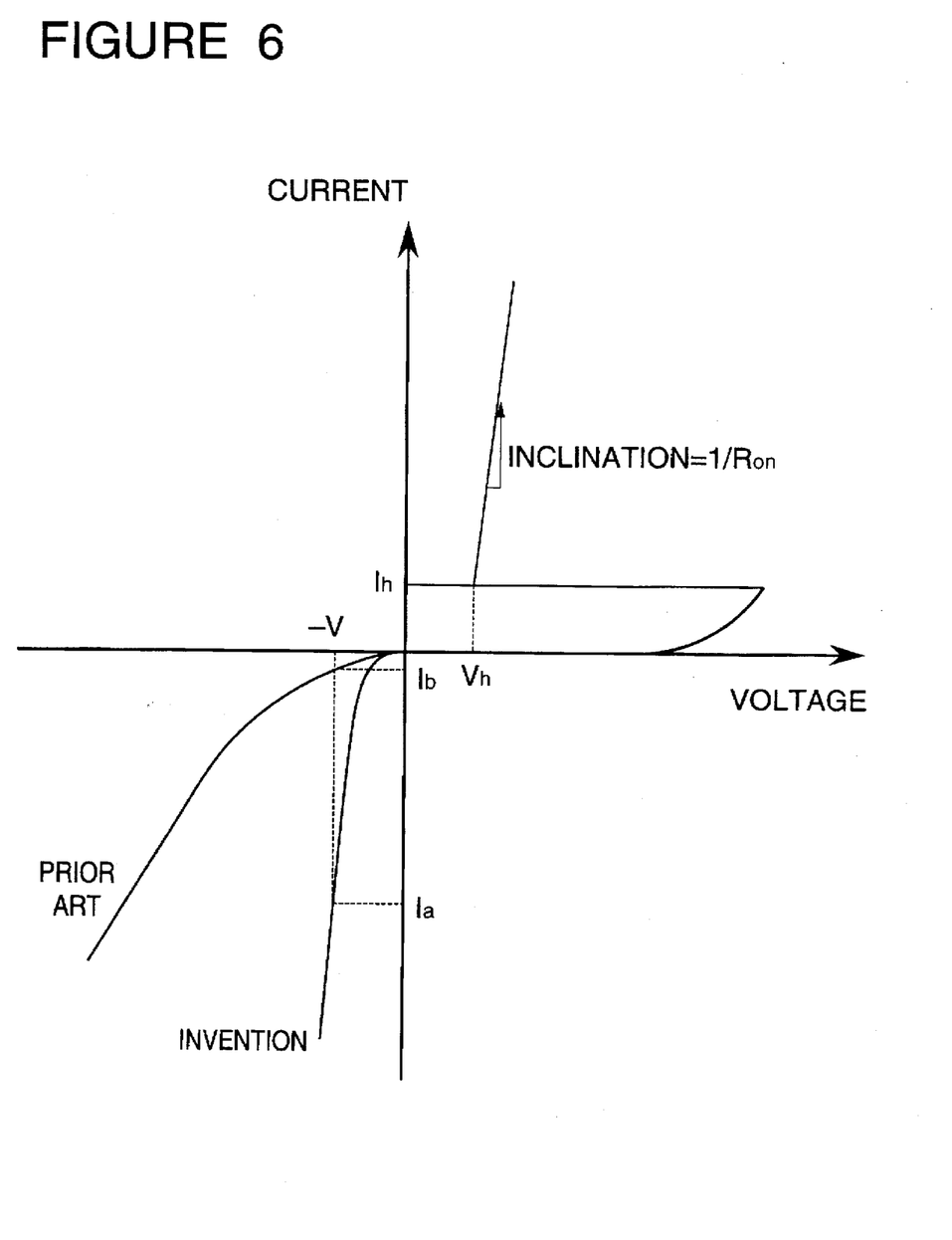
FIG. 6 is a graph illustrating a voltage-current characteristics of the protection device in accordance with the present invention and the prior art lateral thyristor.

Referring to FIG. 6, there is shown a graph illustrating the voltage-current characteristics of the protection device in accordance with the present invention and the prior art example. In the forward direction thyristor characteristics, the holding voltage Vh, the holding current Ih and the conduction resistance Ron change dependently upon the resistance values R1 and R2 of the resistors 11 and 12. In ordinary cases, the resistance values R1 and R2 are set to a low value, but when the protection device in accordance with the present invention is connected to the terminal 10 which is a power supply terminal, the resistance values R1 and R2 of the resistors 11 and 12 are increased to a necessary extent to make the holding voltage Vh and the holding current Ih higher than those of other terminals, in order to prevent an unexpected turn-on caused by noises.

Next, consider that an electrostatic pulse negative to the ground line G is applied to the terminal 10. A discharge path is constituted as shown by a path "b" in FIG. 5. Here, ignoring the parasitic resistance of the diode D, the resistance of the path "b" is the total resistance R1+R2 of the external resistors 11 and 12. Therefore, the smaller the resistances of the external resistors 11 and 12 are, the smaller the resistance of the discharge path "b" becomes. Namely, the protection device in accordance with the present invention becomes more effective in the application of the negative electrostatic pulse.

Here, to know practical resistance values R1 and R2 of the resistors 11 and 12, the resistance values R1 and R2 are calculated under an assumption that the device enters into the thyristor action with the trigger current of 100 mA when the positive voltage is applied. Also assuming that the build-in potential of the PN junction formed between the P-type diffused region 30 and the N-well 20 is 0.9 V, and the build-in potential of the PN junction formed between the P-type substrate 1 and the N-well 70 is 0.6 V, if the resistance value R1 is not smaller than 9 $\Omega$ (=0.9 V/100 mA), and the resistance value R2 is not smaller than 6 $\Omega$ (=0.6 V/100 mA), the forward conducting current flows, and the device enters the thyristor action.

Therefore, if the resistance values R1 and R2 are set to 9 $\Omega$ and 6 $\Omega$, respectively, the resistance value of the discharge path formed when the negative electrostatic pulse is applied, becomes R1+R2=15 $\Omega$, which is smaller than one-fifteenth of the prior art example (larger than 250 $\Omega$).

In other words, as shown in a negative region in the graph of FIG. 6, when a negative voltage of −V is supplied, the protection device in accordance with the present invention can flow a discharge current "Ia" which is 15 times the discharge current "Ib" flowing through the prior art example. Therefore, the stress applied to the internal circuit is remarkably relaxed.

Referring to FIG. 7, there is shown a block diagram illustrating a part of an example of a CMOS LSI in which the input/output protection devices in accordance with the present invention are incorporated. The CMOS LSI includes different terminals 10, which are an input terminal, an output terminal, a ground (GND) terminal, a power supply (VCC) terminal, or the like), and a number of protection devices in accordance with the present invention, each of which is depicted as a set of a thyristor S and a diode D connected in parallel to each other in FIG. 7, are connected at their one end to the terminals 10 other than the ground terminals, respectively. The other terminal of the protection devices are connected in common to a common discharge line H. The ground terminals are connected directly to an internal circuit IC of the CMOS LSI, and the other terminals are connected to the internal circuit IC through an input buffer such as an input stage CMOS inverter IV or an output buffer composed of a pair of CMOS output transistors Tr3.

With the arrangement shown in FIG. 7, if an electrostatic pulse is applied between any pair of terminals 10 regardless of whether the applied electrostatic pulse is positive or negative, the protection device connected to a positive side terminal exerts the thyristor action (thyristor S), while the protection device connected to a negative side terminal operates as the diode action having a small parasitic resistance (diode D), so that a discharge path having a low impedance is formed.

If the protection devices in accordance with the present invention is replaced with the prior art devices, although the device connected to the positive side terminal becomes a low impedance by means of the thyristor action, the whole of the discharge path does not becomes a low impedance, because the parasitic resistance of the device connected to the negative side terminal is large. If an extra diode having a low impedance were connected in parallel to the prior art device in order to solve this problem of the prior art device, the necessary area of the whole of the protection device becomes large, which is not convenient to microminiaturization of the LSI.

As seen from the above, not only when a positive electrostatic pulse is applied but also when a negative electrostatic pulse is applied, the protection device in accordance with the present invention becomes a sufficiently low impedance so as to effectively flow a discharge current, with the result that the stress applied to the internal circuit can be relaxed, and the electrostatic destroy withstanding voltage can be elevated.

Furthermore, since no extra diode is required in addition to the protection device in accordance with the present invention, the protection device in accordance with the present invention can minimize a necessary area of the protection device.

In the protection device in accordance with the present invention, furthermore, since the resistors are not formed in the semiconductor substrate but formed externally of the semiconductor device, it is possible to control the thyristor action by reducing the resistance of the resistors.

In addition, since there is formed the sixth diffused region which has the impurity concentration lower than that of the fourth diffused region and in which the fourth diffused region is formed, the build-in voltage lowers, and the forward conducting current becomes to easily flow, so that the device easily enters the thyristor action. Secondly, holes injected from the anode of the diode are effectively collected by forming the deep sixth diffused region 70 (namely, the N-well), and therefore, a conduction resistance after the thyristor action becomes small.

The invention has thus been shown and described with reference to the specific embodiment. However, it should be noted that the present invention is in no way limited to the details of the illustrated structures but changes and modifications may be made within the scope of the appended claims.

I claim:

1. An input/output protection device for protecting, from an electrostatic discharge, an internal circuit of a semiconductor integrated circuit formed on a semiconductor substrate, said protection device being connected between a terminal connected to said internal circuit and a common wiring conductor, said protection device comprising:

a thyristor being constituted of a PNP transistor and an NPN transistor formed in said semiconductor substrate and sharing a P-type region of a high impurity concentration and an N-type region of a high impurity concentration which are formed in close proximity to each other in said semiconductor substrate, said thyristor further including a first resistor and a second resistor provided externally of said semiconductor substrate, said first resistor being connected between an emitter and a base of said PNP transistor, and said second resistor being connected between an emitter and a base of said NPN transistor, so that when a positive electrostatic pulse is applied to said terminal, said thyristor allowing a forward current to flow from said terminal through said thyristor to said common wiring conductor; and a diode being constituted of said P-type region of the high impurity concentration and said N-type region of the high impurity concentration in close proximity to each other and is connected to said terminal and said common wiring conductor through said first resistor and said second resistor, respectively, so that when a negative electrostatic pulse is applied to said terminal, said diode allows a forward current to flow from said common wiring conductor to said terminal through a low impedance path including said first resistor, said diode and said second resistor, without a parasitic resistance in said semiconductor substrate.

2. An input/output protection device claimed in claim 1 wherein said first resistor and said second resistor provide a holding current, a holding voltage and a conduction resistance of a forward direction thyristor characteristics of said thyristor.

3. An input/output protection device for protecting, from an electrostatic discharge, an internal circuit of a semiconductor integrated circuit formed on a semiconductor substrate, said protection device being connected between a terminal connected to said internal circuit and a common wiring conductor, said protection device comprising a thyristor and a diode both formed in said semiconductor substrate, said thyristor being constituted of a first bipolar transistor and a second bipolar transistor of different conductivity types, both formed in said semiconductor substrate, and a first resistor and a second resistor both provided externally of said semiconductor substrate, said first bipolar transistor being constituted of a first diffused region and a second diffused region both of which are of a first conductivity type and are formed in said semiconductor substrate, and a third diffused region which is of a second conductivity type opposite to said first conductivity type and which is formed in said semiconductor substrate between said first diffused region and said second diffused region, said second diffused region and said third diffused region being of a high impurity concentration, said second bipolar transistor being constituted of said third diffused region, said second diffused region and a fourth diffused region which is of said second conductivity type and which is formed in said semiconductor substrate at a side of said second diffused region opposite to said third diffused region, said first resistor being connected between said first diffused region and said third diffused region, and said second resistor being connected between said second diffused region and said fourth diffused region, so that when a positive electrostatic pulse is applied to said terminal, said thyristor allowing a forward conducting current to flow from said terminal through said thyristor to said common wiring conductor, and said diode being constituted of said second diffused region and said third diffused region, said second diffused region and said third diffused region being formed in close proximity to each other, so that when a negative electrostatic pulse is applied to said terminal, said diode allows a forward current to flow from said common wiring conductor to said terminal through a low impedance path including said first resistor, said diode and said second resistor.

4. An input/output protection device claimed in claim 3 wherein said first diffused region is formed in a fifth diffused region which is formed in said semiconductor substrate and which is of said second conductivity type opposite to that of said semiconductor substrate.

5. An input/output protection device claimed in claim 4 wherein said fourth diffused region is formed in a sixth diffused region which is formed in said semiconductor substrate and which is of said second conductivity type opposite to that of said semiconductor substrate.

6. An input/output protection device claimed in claim 5 wherein said fifth diffused region and said sixth diffused region are formed deeply in said semiconductor substrate.

7. An input/output protection device claimed in claim 6 wherein said sixth diffused region has an impurity concentration lower than that of said fourth diffused region.

8. An input/output protection device for protecting an internal circuit of a semiconductor integrated circuit formed on a semiconductor substrate from an ESD, comprising:

a thyristor comprising:
a first bipolar transistor and a second bipolar transistor of different conductivity types formed in said semiconductor substrate; and
a first resistor and a second resistor both provided externally of said semiconductor substrate, said first resistor being connected between an emitter and a base of said first bipolar transistor and said second resistor being connected between an emitter and a base of said second bipolar transistor.

9. An input/output protection device claimed in claim 8 wherein said thyristor further includes a diode formed by a high impurity N-type diffusion and P-type diffusion pair in close proximity to each other, which are shared by said first bipolar transistor and said second bipolar transistor and formed in said semiconductor substrate.

10. An input/output protection device claimed in claim 9 wherein said thyristor is connected between a terminal connected to said internal circuit and a common wiring conductor of said semiconductor integrated circuit.

11. An input/output protection device claimed in claim 10 wherein said first bipolar transistor is a PNP transistor and said second bipolar transistor is and NPN transistor.

12. An input/output protection device claimed in claim 11 whereby when a negative electrostatic pulse is applied to said terminal, said diode allows a forward current to flow from said common wiring conductor to said terminal through a low impedance path including said first resistor, said diode and said second resistor.

13. An input/output protection device claimed in claim 12 wherein said first resistor has a resistance not less than 9 ohms and said second resistor has a resistance not less than 6 ohms.

14. An input/output protection device claimed in claim 13 wherein said first resistor and said second resistor are formed from one of the materials selected from the group consisting of phosphorous doped polysilicon, tungsten silicide, and tungsten.

15. An input/output protection device for protecting an internal circuit of a semiconductor integrated circuit formed on a P-type semiconductor substrate from an ESD by using a thyristor connected between a terminal connected to said internal circuit and a common wiring conductor, comprising:

an first N-well formed in said P-type substrate;
a first P-type diffusion region formed in said N-well and connected to the terminal;
a first N-type diffusion region formed to adjoin said first N-well;
a second P-type diffusion region formed in close proximity to said first N-type diffusion region;
a second N-type diffusion region formed in said P-type substrate and connected to said common wiring conductor;

a first resistor external to said substrate and connected between said first P-type diffusion region and said first N-type diffusion region; and a second resistor external to said substrate and connected between said second P-type diffusion region and said second N-type diffusion region.

16. An input/output protection device claimed in claim 15 wherein said first N-type diffusion region and said second P-type diffusion region constitute a diode having low parasitic resistance.

17. An input/output protection device claimed in claim 16 whereby when a negative electrostatic pulse is applied to the terminal, said diode allows a forward current to flow from the common wiring conductor to the terminal through a low impedance path including said first resistor, said diode, and said second resistor.

18. An input/output protection device claimed in claim 17 wherein said first resistor has a resistance not less than 9 ohms and said second resistor has a resistance not less than 6 ohms.

19. An input/output protection device claimed in claim 17 wherein said first resistor and said second resistor are formed from one of the materials selected from the group consisting of phosphorous doped polysilicon, tungsten silicide, and tungsten.

* * * * *

UNITED STATES PATENT AND TRADEMARK OFFICE
CERTIFICATE OF CORRECTION

PATENT NO.   : 5,717,559
DATED        : February 10, 1998
INVENTOR(S)  : Narita

It is certified that error(s) appears in the above-identified patent and that said Letters Patent is hereby corrected as shown below:

Column 3, line 16, after "from", insert --destruction due to--.

Signed and Sealed this

Thirtieth Day of June, 1998

Attest:

BRUCE LEHMAN

Attesting Officer        Commissioner of Patents and Trademarks